US009257558B2

United States Patent
Lee et al.

(10) Patent No.: US 9,257,558 B2
(45) Date of Patent: Feb. 9, 2016

(54) FINFET DEVICE WITH GATE OXIDE LAYER

(71) Applicant: Taiwan Semiconductor Manufacturing Company, Ltd., Hsin-Chu (TW)

(72) Inventors: Tung Ying Lee, Hsinchu (TW); Yu-Lien Huang, Hsinchu (TW); I-Ming Chang, ShinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/328,350

(22) Filed: Jul. 10, 2014

(65) Prior Publication Data

US 2016/0013308 A1    Jan. 14, 2016

(51) Int. Cl.
*H01L 21/336* (2006.01)
*H01L 29/78* (2006.01)
*H01L 29/66* (2006.01)
*H01L 29/51* (2006.01)
*H01L 29/36* (2006.01)

(52) U.S. Cl.
CPC .............. *H01L 29/785* (2013.01); *H01L 29/36* (2013.01); *H01L 29/513* (2013.01); *H01L 29/66795* (2013.01)

(58) Field of Classification Search
CPC ............ H01L 29/785; H01L 29/66795; H01L 29/513; H01L 29/36

USPC .................... 257/283, 327; 438/283
See application file for complete search history.

(56) References Cited

U.S. PATENT DOCUMENTS

2009/0008705 A1\* 1/2009 Zhu et al. ........................ 257/327
2014/0197456 A1\* 7/2014 Wang et al. .................... 257/192

OTHER PUBLICATIONS

U.S. Appl. No. 14/254,035, filed Apr. 16, 2014, by inventors Kuo-Cheng Ching, Ka-Hing Fung, Chih-Sheng Chang, and Zhiqiang Wu for "FinFET Device with High-K Metal Gate Stack," 22 pages of text, 14 pages of drawings.

\* cited by examiner

*Primary Examiner* — Kevin M Picardat
(74) *Attorney, Agent, or Firm* — Haynes and Boone, LLP (57) ABSTRACT

The present disclosure provides a semiconductor structure. In accordance with some embodiments, the semiconductor structure includes a substrate, one or more fins each including a first semiconductor layer formed over the substrate, an oxide layer formed wrapping over an upper portion of each of the one or more fins, and a gate stack including a high-K (HK) dielectric layer and a metal gate (MG) electrode formed wrapping over the oxide layer. The first semiconductor layer may include silicon germanium (SiGex), and the oxide layer may include silicon germanium oxide (SiGexOy).

20 Claims, 7 Drawing Sheets

FINFET DEVICE WITH GATE OXIDE LAYER

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, has been introduced to replace a planar transistor. Although existing semiconductor devices and methods of fabricating semiconductor devices have been generally adequate for their intended purposes, they have not been entirely satisfactory in all respects. For example, to introduce three dimensional nanostructure to a gate channel raises challenges in a semiconductor device process development. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIGS. 1A-1B, 2, and 3A-3B are diagrammatic side views and/or corresponding cross sectional views illustrating a PMOS FinFET device precursor 100 at various fabrication steps according to some embodiments of the present disclosure. It is understood, however, that the present disclosure should not be limited to a particular type of device, except as specifically claimed. It is also understood that additional steps can be provided before, during, and after the method, and some of the steps described can be replaced or eliminated for other embodiments of the method.

Figure 1A:
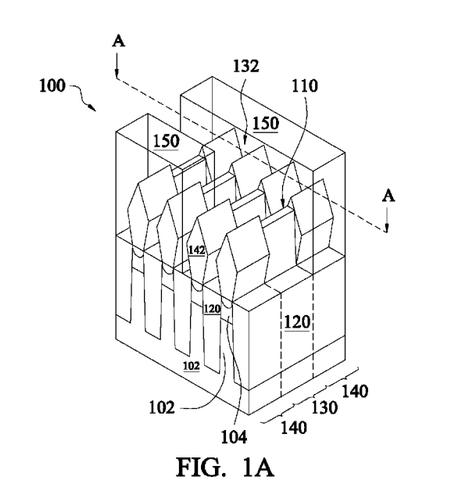
FIGS. 1A and 3A are diagrammatic side views illustrating a P-type metal-oxide-semiconductor (PMOS) FinFET device at various fabrication steps according to some embodiments of the present disclosure.
Figure 1B:
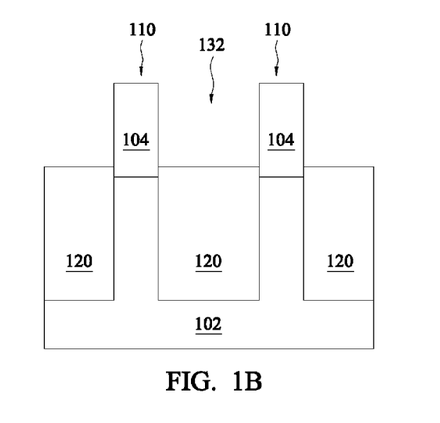
FIGS. 1B, 2 and 3B are cross sectional views of the PMOS FinFET device along the line A-A in FIGS. 1A and 3A at various fabrication stages according to some embodiments of the present disclosure.

Referring to FIGS. 1A-1B, a PMOS device precursor 100 may be provided. The device precursor 100 includes a substrate 102. In some embodiments, the substrate 102 may include an elementary semiconductor, such as silicon or germanium in a crystalline structure. The substrate 102 may also include a compound semiconductor, such as silicon germanium, silicon carbide, gallium arsenic, gallium phosphide, indium phosphide, indium arsenide, indium antimonide, or combinations thereof. Possible substrate 102 may also include a semiconductor-on-insulator substrate, such as silicon-on-insulator (SOI), SiGe-On-Insulator (SGOI), Ge-On-Insulator substrates. For example, SOI substrates may be fabricated using separation by implantation of oxygen (SIMOX), wafer bonding, and/or other suitable methods. In the present embodiment, the substrate 102 includes a bulk silicon substrate. In some embodiments, various doped regions may also be included in the substrate 102.

Still referring to FIGS. 1A-1B, the PMOS device precursor includes one or more fins 110 formed over the substrate 102. Each of the fins 110 in the PMOS device precursor 100 may include one or more semiconductor layers 104 formed over the substrate 102. In some embodiments, the semiconductor layer 104 includes germanium (Ge), silicon (Si), gallium arsenide (GaAs), silicon germanium (SiGe), gallium arsenide phosphide (GaAsP), or other suitable materials. In the present embodiment, the semiconductor layer 104 includes SiGex, where the concentration percentage x of Ge in the SiGex layer 104 may be in a range from about 10% to about 100%. The thickness of the semiconductor layer 104 may be in a range from about 10 nm to about 80 nm.

As shown in FIGS. 1A-1B, the PMOS device precursor 100 may also include one or more isolation regions 120. Isolation regions 120 are formed over the substrate 102 to isolate fins 110 from each other. The isolation regions 120 may be formed using traditional isolation technology, such as shallow trench isolation (STI), to define and electrically isolate the fins 110. In some examples, the isolation regions 120 may include silicon oxide, silicon nitride, silicon oxynitride, other suitable materials, or combinations thereof.

The processes for forming the fins 110 and the isolation regions 120 of the PMOS device precursor 100 may include various embodiments. In some examples, the fins 110 may be formed prior to the formation of the isolation regions 120 ("isolation-last process"). The isolation-last process may include deposition of the semiconductor layer 104, photolithography, etching trenches corresponding to the isolation regions 120 (for example, by using a dry etching and/or wet etching) to expose the fins 110, and filling the trenches (for example, by using a chemical vapor deposition process) with one or more dielectric materials to form the isolation regions 120.

In some examples, the semiconductor layer 104 may be deposited by epitaxial growing processes, such as chemical vapor deposition (CVD), Vapor Phase Epitaxy (VPE), ultra high vacuum (UHV)-CVD, molecular beam epitaxy (MBE), and/or other suitable processes. Then trenches corresponding to the isolation regions 120 may be formed in the substrate 102 and the semiconductor layer 104 to form the fins 110. The trenches corresponding to the isolation regions 120 may be formed using lithography and etching processes. The photolithography process may include forming a photoresist layer (resist) overlying the substrate 102 and the semiconductor layer 104, exposing the resist to a pattern, performing a post-exposure bake process, and developing the resist to form masking elements including the resist. The substrate 102 and the deposited semiconductor layer 104 may then be recessed using the masking elements by any appropriate dry etching and/or wet etching methods. The recessing process may include a dry etching process, a wet etching process, or combinations thereof. The reaction gases used in the dry etching process may include hydrogen fluoride (HF), ammonia (NH3), nitrogen trifluoride (NF3), boron trichloride (BCl3), chlorine (Cl2), hydrogen bromide (HBr), oxygen (O2), and/or the like, or combinations thereof. The dry etching process may also include using inductively coupled plasma (ICP), transformer coupled plasma (TCP), electron cyclotron resonance (ECR), reactive ion etch (RIE), and/or the like. The wet etching process may include using etchant such as tetramethylammonium hydroxide (TMAH), diluted hydrogen fluoride (HF), or other suitable etchants. After forming the trenches corresponding to the isolation regions 120 using the recessing processes, the isolation regions 120 may be deposited to fill the trenches. In some examples, the filled trenches may have a multi-layer structure such as a thermal oxide liner layer filled with silicon nitride or silicon oxide. In some embodiments, a chemical mechanical polishing (CMP) process may then be performed to remove excessive dielectric materials and to planarize the top surface of the isolation regions 120.

In some alternative examples, the fins 110 may be formed after the formation of the isolation regions 120 ("isolation-first process"). The isolation-first process may include depositing an isolation layer over the substrate 102, patterning the isolation layer using photolithography, recessing to form trenches corresponding to the fins 110, and filling the trenches corresponding to the fins 100 by epitaxially growing or depositing the semiconductor layer 104 over the substrate 102 in the trenches. The surface of the PMOS device precursor 100 may be then planarized using a CMP process.

Still referring to FIGS. 1A-1B, the PMOS device precursor 100 also includes source/drain regions 140 and a gate region 130. In furtherance of the embodiment, one of the source/drain regions 140 is a source region, and another of the source/drain regions 140 is a drain region. The source/drain regions 140 are separated by the gate region 130.

In one embodiment using a gate-last process, a gate stack is a dummy gate and will be replaced by the final gate stack at a subsequent stage. Particularly, the dummy gate stack is to be replaced later by a high-k dielectric layer (HK) and metal gate electrode (MG). The dummy gate stack may be formed in the gate region 130 and over the fins 110 and the isolation regions 120. In one embodiment, the dummy gate stack may include a dielectric layer, an electrode layer, and a gate hard mask. The dielectric layer may include silicon oxide, silicon nitride, a high-k dielectric material, or other suitable material. The electrode layer may include polycrystalline silicon (polysilicon). The gate hard mask may include a suitable dielectric material, such as silicon nitride, silicon oxynitride, silicon carbide, and/or the like.

The dummy gate stack may be formed by a suitable procedure including deposition and patterning. The deposition may include CVD, physical vapor deposition (PVD), ALD, thermal oxidation, other suitable techniques, or a combination thereof. The patterning process may further include lithography and etching. The lithography process includes photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). After patterning the dummy gate stack, the dummy gate stack may be recessed to form trenches in the source/drain regions 140. The recessing process may include dry etching process, wet etching process, and/or appropriate combination thereof.

Before forming source/drain features 142 in the trenches in the source/drain regions 140, sidewall spacers may be formed along the recessed dummy gate. The sidewall spacers may include a dielectric material such as silicon oxide, silicon nitride, silicon carbide, silicon oxynitride, or combinations thereof. The sidewall spacers may include multiple layers. Typical formation methods for the sidewall spacers may include depositing a dielectric material over the gate stack and then anisotropically etching back the dielectric material. The etching back process may include a multiple-step etching to gain etch selectivity, flexibility and desired overetch control.

Still referring to FIG. 1A, source/drain features 142 may be formed in the source/drain regions 140. In some examples, an upper portion of the fins 110 in the source/drain regions 140 may be recessed to leave the remaining semiconductor layer 104 or the substrate 102 with a desired height. The source/drain features 142 may be formed by one or more epitaxial growing processes. The source/drain features 142 may be in-situ doped during the epitaxial process. For example, the epitaxially grown SiGe source/drain features may be doped with boron; and the epitaxially grown Si epitaxial source/drain features may be doped with carbon to form silicon:carbon (Si:C) source/drain features, phosphorous to form silicon:phosphor (Si:P) source/drain features, or both carbon and phosphorous to form silicon carbon phosphor (SiCP)

source/drain features. In some embodiments, the source/drain features 142 are not in-situ doped, and an implantation process (i.e., a junction implant process) may be performed to dope the source/drain features 142. One or more doping processes may be used to form light doped drain (LDD) features and heavily doped source and drain features. In some embodiments, one or more annealing processes may be performed to activate source/drain epitaxial feature. The annealing processes may comprise rapid thermal annealing (RTA) and/or laser annealing processes.

Still referring to FIG. 1, an interlayer dielectric (ILD) layer 150 may be formed over the source/drain features 142 and between the gaps of gate regions 130. The ILD layer 150 includes silicon oxide, silicon oxynitride, low k dielectric material or other suitable dielectric materials. The ILD layer 150 may include a single layer or alternative multiple layers. The ILD layer 150 may be formed by a suitable technique, such as CVD, ALD, flow-able CVD, and spin-on (e.g., spin-on dielectric such as spin-on glass SOG). After forming the ILD layer 150, a chemical mechanical polishing (CMP) process may be performed to remove excessive ILD layer 720 and to planarize the top surface.

Still referring to FIG. 1, the dummy gate stack is removed to form one or more gate trenches 132. The dummy gate stacks may be removed by an etch process (such as selective wet etch or selective dry etch) designed to have an adequate etch selectivity with respect to the fins 110 and the isolation regions 120. The etch process may include one or more etch steps with respective etchants. The gate hard mask layer and the spacers are removed as well. Alternatively, the dummy gate stack may be removed by a series of processes including photolithography patterning and etching process. In the present embodiments, after removing the dummy gate stack, upper portions of the fins 110 and the isolation regions 120 in the gate trenches 132 are exposed.

Figure 2:
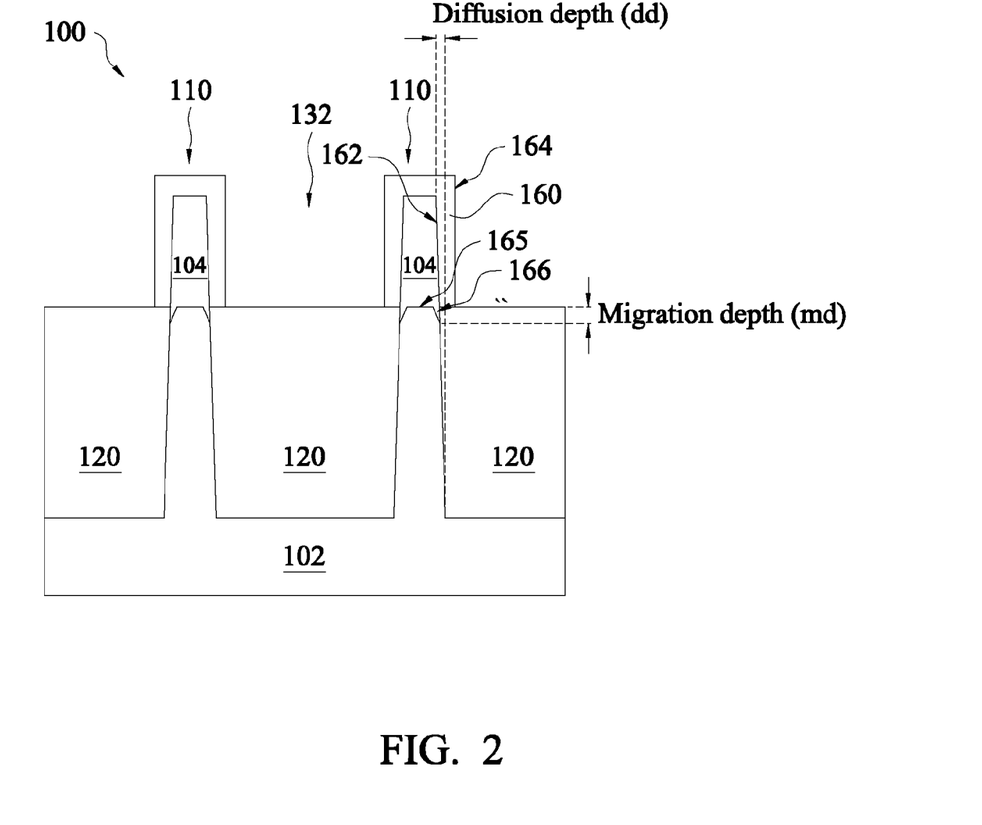

Referring to FIG. 2, an oxide layer 160 is formed over surfaces of the upper portions of the fins 110 exposed in the gate trenches 132. The oxide layer 160 may be formed using a deposition process. In order to use channel materials with high mobility, such as SiGe, a low temperature deposition process is desirable to preserve the device performance and avoid the device degradation. The low temperature deposition process may include CVD, PVD, ALD, PECVD (plasma enhanced ALD), MLD (molecular layer deposition), thermal oxidation, other suitable techniques, or a combination thereof. In some embodiments, one or more precursors such as $Si[(C_2H_5)_2N]_2H_2$, $O_2$ may be used in the low temperature deposition process.

In the present embodiments, the oxide layer 160 is formed using a plasma enhanced ALD process. The plasma enhanced ALD process may be performed in a temperature range from about 150° C. to about 400° C. In some preferable embodiments, the plasma enhanced ALD process is performed in at temperature lower than or equal to 350° C. In some embodiments, oxygen ($O_2$) plasma is used in the plasma enhanced ALD process with a power range from about 5 W to about 1000 W. In some preferable embodiments, the power applied in the plasma enhanced ALD process may be in a range from about 10 W to about 30 W. The $O_2$ flow rate may be in a range from about 10 sccm to about 1000 sccm. The plasma treatment may be performed in a time range from about 10 seconds to about 150 seconds. In some embodiments, $NO_2$, $O_3$, or $CO_2$ may also be used in the plasma enhanced ALD process.

Still referring to FIG. 2, after the plasma enhanced ALD process, a plasma treatment process may further be performed to the PMOS device precursor 100. In some embodiments, oxygen ($O_2$) plasma is used for the plasma treatment, and the radio frequency (RF) power may be applied in a range from about 10 W to about 1000 W. In some preferable embodiments, the RF power applied in the plasma treatment may be in a range from about 200 W to about 600 W. In some embodiments, when $O_2$ plasma is used in the previous plasma enhanced ALD process, the power of the $O_2$ plasma used in the plasma enhanced ALD process is less than the power of the $O_2$ plasma used in the plasma treatment process. The $O_2$ flow rate may be in a range from about 10 sccm to about 1000 sccm. The plasma treatment may be performed in a time range from about 10 seconds to about 150 seconds. The plasma treatment may be performed at a temperature lower than or equal to 350° C. In some embodiments, the plasma enhanced ALD process and the plasma treatment may be performed in-situ in the same deposition tool. In some alternative embodiments, the plasma enhanced ALD process and the plasma treatment may be performed in different deposition tools.

As shown in FIG. 2, after performing the plasma enhanced ALD process followed by the plasma treatment, an oxide layer 160 is formed to wrap around an upper portion of the fins 110 exposed in the gate trenches 132. In the present embodiments, the oxide layer 160 is formed over the surfaces of the SiGex layer 104 that are exposed in the gate trenches 132. The thickness of the oxide layer 160 may be in a range from about 0.5 nm to about 4 nm. For example, when the PMOS device precursor 100 is used in an input/output (I/O) device, the thickness of the oxide layer 160 may be in a range from about 2.5 nm to about 4 nm. When the PMOS device precursor 100 is used in a core device, the thickness of the oxide layer 160 may be in a range from about 0.5 nm to about 1.5 nm. In some embodiments, the oxide layer 160 may include a single-layer structure or a multiple-layer structure.

During the plasma treatment, Ge may diffuse from the fins 110 into the deposited oxide layer 160, thus the oxide layer 160 may include silicon germanium oxide (SiGexOy), where y>0, and the concentration Ge in the oxide layer 160 is greater than 0%. The concentration of Ge may vary for different locations in the oxide layer 160. In some examples, the concentration x of Ge in the oxide layer 160 may have a graded change in a direction extending from the inner surface 162 to the outer surface 164 of the oxide layer 160, for example, the concentration x of Ge may decrease from the inner surface 162 towards the outer surface 164 of the oxide layer 160. The concentration of Ge may increase from the center of the fin 110 towards the surface of the fin 110 (e.g., the surface 162). For example, the concentration of Ge at the surface 162 of the fin 110 may be at least 10% greater than the concentration of Ge at the center of the fin 110. In some preferable embodiments, the concentration of Ge at the surface 162 of the fin 110 may be about 10% to about 30% greater than the surface of the fin 110. In some embodiments as shown in FIG. 2, the diffusion depth (dd) of Ge from the fins 110 into the oxide layer 160 may be a distance of Ge diffusing from the inner surface 162 to a location where the concentration of Ge substantially equals to 0. The diffusion depth (dd) may be no less than 1 nm. For example, the diffusion depth (dd) may be in a range from about 2 nm to about 3 nm in the oxide layer 160.

During the plasma treatment, Ge may also migrate from the upper portion towards the lower portions of the fins. As shown in FIG. 2, Ge may migrate in the regions near and along the sides of each of the fins 110 to form downward protruding portions 166 near the interface 165 between the semiconductor layer 104 and the substrate 102. In some embodiments, the migration depth (md) corresponding to a dimension of the downward protruding portions 166 along the height of the fins may be in a range from about 1.5 nm to about 6 nm. In some preferable embodiments, the migration depth (md) of the downward protruding portions 166 may be in a range from about 2.2 nm to about 4.8 nm. In some embodiments, the concentration of Ge in the downward protruding portions 166 may have a gradient distribution.

Figure 3A:
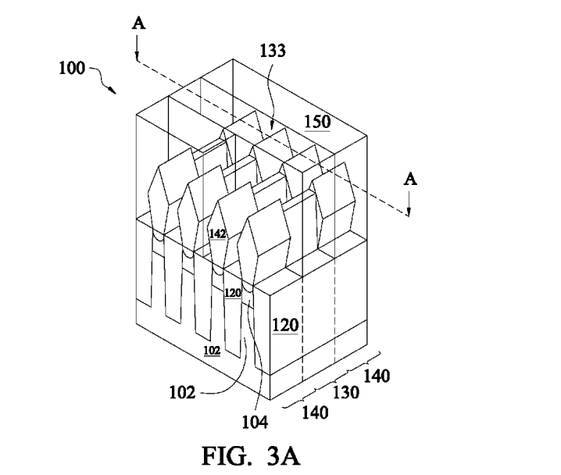
Figure 3B:
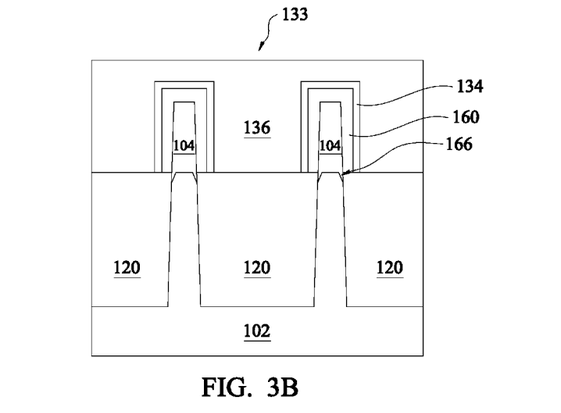

Referring to FIGS. 3A-3B, a gate stack 133 including a high-K (HK) dielectric layer 134 and a metal gate (MG) electrode 136 may be formed in the gate region 130. In some embodiments, the HK dielectric layer 134 and the MG electrode 136 may be formed to wrap around the oxide layer 160 to cover the surfaces of the fins 110. The HK dielectric layer 134 may be deposited over and wrapping around the oxide layer 160 by any suitable techniques, such as ALD, CVD, metal-organic CVD (MOCVD), physical vapor deposition (PVD), thermal oxidation, combinations thereof, or other suitable techniques. The HK dielectric layer 134 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

The MG electrode 136 may include a single layer or multi layers, such as metal layer, liner layer, wetting layer, and adhesion layer. The MG electrode 136 may include Ti, Ag, Al, TiAlN, TaC, TaCN, TaSiN, Mn, Zr, TiN, TaN, Ru, Mo, Al, WN, Cu, W, or any suitable materials. The MG electrode 136 may be formed by ALD, PVD, CVD, or other suitable process. A CMP process may be performed after the deposition process to remove excessive MG electrode 136. The CMP process provides a substantially planar top surface for the gate region 130 as well as ILD layers 150 in the PMOS device precursor 100.

Figure 4A:
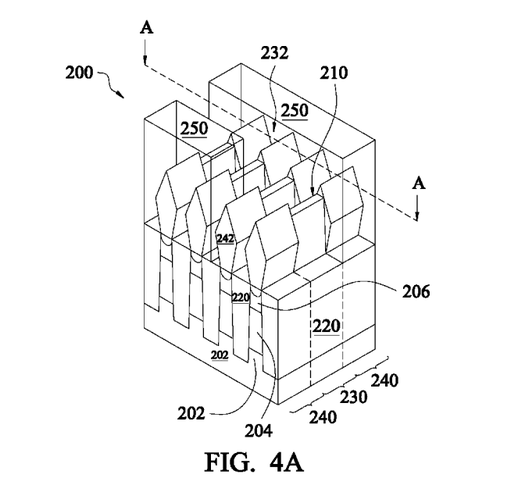
FIGS. 4A and 6A are diagrammatic side views illustrating a N-type metal-oxide-semiconductor (NMOS) FinFET device at various fabrication steps according to some embodiments of the present disclosure.
Figure 4B:
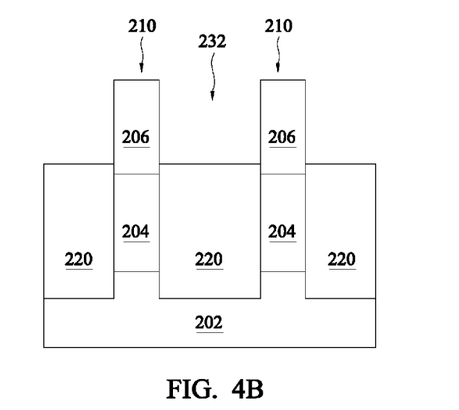
FIGS. 4B, 5 and 6B are cross sectional views of the NMOS FinFET device along the line A-A in FIGS. 4A and 6A at various fabrication stages according to some embodiments of the present disclosure.

FIGS. 4A-4B, 5, and 6A-6B are diagrammatic side views and/or corresponding cross sectional views illustrating a NMOS FinFET device precursor 200 at various fabrication steps according to some embodiments of the present disclosure. As shown in FIGS. 4A-4B, the NMOS device precursor 200 includes a substrate 202, one or more fins 210 formed over the substrate 202 and separated by one or more isolation regions 220. The NMOS device precursor 200 also includes a gate region 230 and source/drain regions 240. Source/drain features 242 may be formed in the source/drain regions 240, and interlayer dielectric (ILD) layers 250 may be formed over the source/drain features 242 and between the gaps of gate regions 230. Gate trenches 232 may be formed in the gate region 230 to expose the one or more fins 210 as shown in FIGS. 4A-4B. In some embodiments, the materials and the formation processes for the substrate 202, the isolation regions 220, the gate region 230, the source/drain regions 240, the source/drain features 242, the ILD layers 250, and the gate trenches 232 may be substantially similar to the substrate 102, the isolation regions 120, the gate region 130, the source/drain regions 140, the source/drain features 142, the ILD layers 150, and the gate trenches 132 as discussed with regard to FIGS. 1A-1B.

As shown in FIGS. 4A-4B, the fins may include one or more semiconductor layers. In some embodiments, each of the fins 210 includes a first semiconductor layer 204 formed over the substrate 202, and a second semiconductor layer 204 formed over the first semiconductor layer 204. In some embodiments, each of the first semiconductor layer 204 and the second semiconductor layer 206 may include germanium (Ge), silicon (Si), gallium arsenide (GaAs), silicon germanium (SiGe), gallium arsenide phosphide (GaAsP), or other suitable materials. In the present embodiment, the substrate 202 includes Si, the first semiconductor layer 204 includes SiGex, and the second semiconductor layer includes Si. The thickness of the first semiconductor layer 204 may be in a range from about 10 nm to about 1500 nm. The concentration percentage x of Ge in the SiGex layer 204 may be in a range from about 10% to about 100%. The thickness of the second semiconductor layer 206 may be in a range from about 10 nm to about 80 nm. In some embodiments, the formation the fins 210 including the first semiconductor layer 204 and the second semiconductor layer 206 may be formed prior to the formation of the isolation regions 220 using the isolation-last process, or the fins 210 may be formed after the formation of the isolation regions 220 using the isolation-first process, as discussed with regard to the PMOS device precursor 100.

Figure 5:
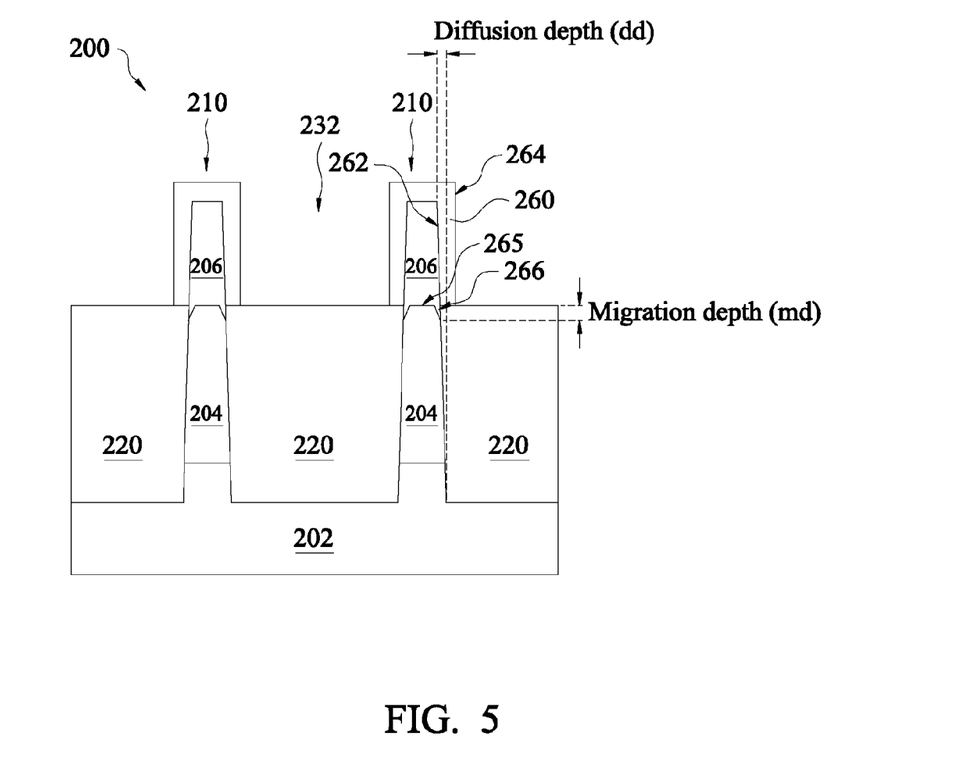

Referring to FIG. 5, an oxide layer 260 is formed over surfaces of the upper portions of the fins 210 exposed in the gate trenches 232. The oxide layer 260 may be formed using a low temperature deposition process. The low temperature deposition process may include CVD, PVD, ALD, PEALD, MLD, thermal oxidation, other suitable techniques, or a combination thereof. In some embodiments, one or more precursors such as $Si[(C_2H_5)_2N]_2H_2$, $O_2$ may be used in the low temperature deposition process.

In the present embodiments, the oxide layer 260 is formed using a plasma enhanced ALD process. The plasma enhanced ALD process may be performed in a temperature range from about 150° C. to about 400° C. In some preferable embodiments, the plasma enhanced ALD process is performed in at temperature lower than or equal to 350° C. In some embodiments, oxygen (O2) plasma is used in the plasma enhanced ALD process with a power range from about 5 W to about 1000 W. In some preferable embodiments, the power applied in the plasma enhanced ALD process may be in a range from about 10 W to about 30 W. The O2 flow rate may be in a range from about 10 sccm to about 1000 sccm. The plasma treatment may be performed in a time range from about 10 seconds to about 150 seconds. In some embodiments, $NO_2$, $O_3$, or $CO_2$ may also be used in the plasma enhanced ALD process.

Still referring to FIG. 5, after the plasma enhanced ALD process, a plasma treatment process may further be performed to the NMOS device precursor 200. In some embodiments, oxygen (O2) plasma is used for the plasma treatment, and the radio frequency (RF) power may be applied in a range from about 10 W to about 1000 W. In some preferable embodiments, the RF power applied in the plasma treatment may be in a range from about 200 W to about 600 W. In some embodiments, when O2 plasma is used in the previous plasma enhanced ALD process, the power of the O2 plasma used in the plasma enhanced ALD process is less than the power of the O2 plasma used in the plasma treatment process. The O2 flow rate may be in a range from about 10 sccm to about 1000 sccm. The plasma treatment may be performed in a time range from about 10 seconds to about 150 seconds. The plasma treatment may be performed at a temperature lower than or equal to 350° C. In some embodiments, the plasma enhanced ALD process and the plasma treatment may be performed in-situ in the same deposition tool. In some alternative embodiments, the plasma enhanced ALD process and the plasma treatment may be performed in different deposition tools.

As shown in FIG. 5, after performing the plasma enhanced ALD process followed by the plasma treatment, the oxide layer 260 is formed to wrap around an upper portion of the fins 210 exposed in the gate trenches 232. In the present embodiments, the oxide layer 260 is formed over the surfaces of the Si layer 206 that are exposed in the gate trenches 232. The thickness of the oxide layer 260 may be in a range from about 0.5 nm to about 4 nm. For example, when the NMOS device precursor 200 is used in an input/output (I/O) device, the thickness of the oxide layer 260 may be in a range from about 2.5 nm to about 4 nm. When the NMOS device precursor 200 is used in a core device, the thickness of the oxide layer 260 may be in a range from about 0.5 nm to about 1.5 nm. In some embodiments, the oxide layer 260 may include a single-layer structure or a multiple-layer structure.

In some embodiments as shown in FIG. 2, the diffusion depth (dd) of Ge from the fins 110 into the oxide layer 160 may be a distance of Ge diffusing from the inner surface 162 to a location where the concentration of Ge substantially equals to 0. The diffusion depth (dd) may be no less than 1 nm. For example, the diffusion depth (dd) may be in a range from about 2 nm to about 3 nm in the oxide layer 160.

During the plasma treatment, Ge may diffuse from the SiGex layer 204 of each of the fins 210 into the deposited oxide layer 260, thus the oxide layer 260 may include silicon germanium oxide (SiGexOy), where y>0, and the concentration Ge in the oxide layer 160 is greater than 0%. The concentration x of Ge may also vary for different locations in the oxide layer 260. In some examples, the concentration x of Ge in the oxide layer 260 may have a graded change in a direction extending from the inner surface 262 towards the outer surface 264 of the oxide layer 260, for example, the concentration x of Ge may decrease from the inner surface 262 to the outer surface 264 of the oxide layer 260. The concentration of Ge may increase from the center of the fin 210 towards the surface of the fin 210 (e.g., the surface 262). For example, the concentration of Ge at the surface 262 of the fin 210 may be at least 10% greater than the concentration of Ge at the center of the fin 210. In some preferable embodiments, the concentration of Ge at the surface 262 of the fin 210 may be about 10% to about 30% greater than the surface of the fin 210. In some embodiments as shown in FIG. 5, the diffusion depth (dd) of Ge from the fins 210 to the oxide layer 260 may be a distance of Ge diffusing from the inner surface 262 to a location where the concentration of Ge substantially equals to 0. The diffusion depth (dd) may be no less than 1 nm. For example, the diffusion depth (dd) may be in a range from about 2 nm to about 3 nm in the oxide layer 260.

During the plasma treatment, Ge may also migrate upwards from the SiGex layer 204 towards the Si layer 206. As shown in FIG. 5, Ge may migrate in the regions near and along the sides of each of the fins 210 to form upward protruding portions 266 near the interface 265 between the first semiconductor layer 204 and the second semiconductor layer 206. In some embodiments, the migration depth (md) corresponding to a dimension of the upward protruding portions 266 along the height of the fins may be in a range from about 1.5 nm to about 6 nm. In some preferable embodiments, the migration depth (md) of the upward protruding portions 266 may be in a range from about 2.2 nm to about 4.8 nm.

Figure 6A:
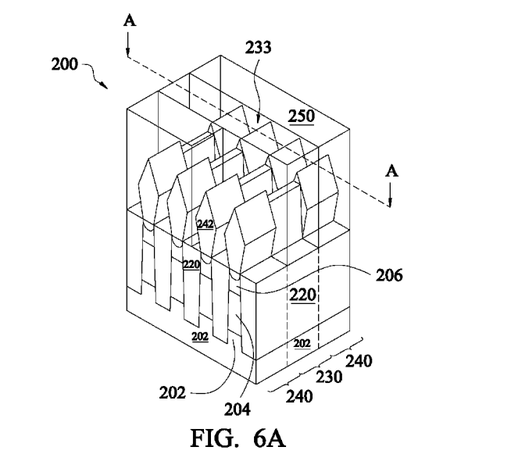
Figure 6B:
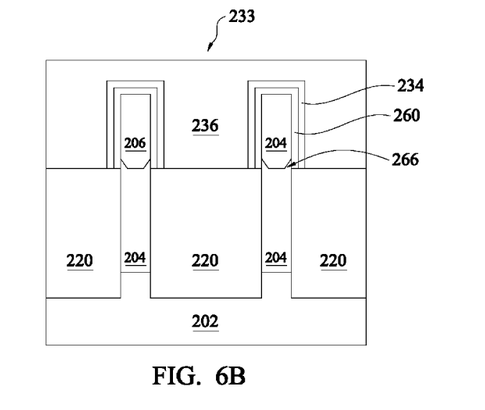

Referring to FIGS. 6A-6B, a gate stack 233 including a high-K (HK) dielectric layer 234 and a metal gate (MG) electrode 236 may be formed in the gate region 230. In some embodiments, the HK dielectric layer 234 and the MG electrode 236 may be formed to wrap around the oxide layer 260 to cover the surfaces of the fins 210. The HK dielectric layer 234 may be deposited over and wrapping around the oxide layer 260 by any suitable techniques, such as ALD, CVD, metal-organic CVD (MOCVD), physical vapor deposition (PVD), thermal oxidation, combinations thereof, or other suitable techniques. The HK dielectric layer 234 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

The MG electrode 236 may include a single layer or multi layers, such as metal layer, liner layer, wetting layer, and adhesion layer. The MG electrode 236 may include Ti, Ag, Al, TiAlN, TaC, TaCN, TaSiN, Mn, Zr, TiN, TaN, Ru, Mo, Al, WN, Cu, W, or any suitable materials. The MG electrode 236 may be formed by ALD, PVD, CVD, or other suitable process. A CMP process may be performed after the deposition process to remove excessive MG electrode 236. The CMP process provides a substantially planar top surface for the gate region 230 as well as ILD layers 250 in the NMOS device precursor 200.

Although the formation processes of the oxide layer 160 of the PMOS device precursor 100 and the oxide layer 260 of the NMOS device precursor 200 include a gate-last process as discussed in the present disclosure, it is to be understood the oxide layer 160 and/or the oxide layer 260 may also be formed a gate-first process. The oxide layer 160 and/or the oxide layer 260 may be applied to I/O device or core device.

Figure 7:
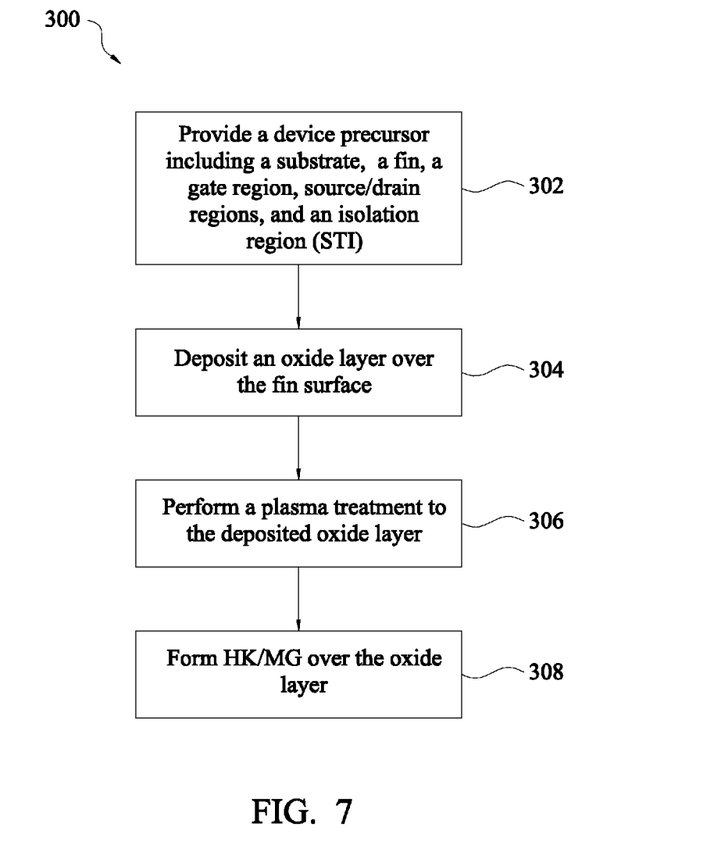
FIG. 7 is a flow chart of an example method for fabricating the PMOS FinFET device and/or the NMOS FinFET device according to various aspects of the present disclosure.

FIG. 7 is a flow chart illustrating a method 300 for fabricating the PMOS device precursor 100 and/or the NMOS device precursor 200 according to some embodiments of the present disclosure. Method 300 includes a process 302 for providing a FinFET device precursor, a process 304 for depositing an oxide layer over the fins, a process 306 for performing a plasma treatment to the deposited oxide layer, and a process 308 for forming a high-K (HK) dielectric layer and a metal gate (MG) electrode over the oxide layer. It should be understood that additional processes may be provided before, during, and after the method 300 of FIG. 7, and that some other processes may be briefly described herein.

At process 302, the FinFET device precursor, e.g., the PMOS device precursor 100, and/or the NMOS device precursor 200 is provided. In some embodiments, the FinFET device precursor includes a substrate, one or more fins formed over the substrate and separated by one or more isolation regions. A gate region may be formed between the adjacent source/drain regions. Source/drain features may be formed in the source/drain regions, and ILD layers may be formed over the source/drain features. A gate trench may be formed in the gate region.

At process 304, an oxide layer is deposited over the surfaces of each of the fins. The oxide layer may be deposited over an upper portion of the each of the fins exposed in the gate trench using a suitable deposition process including CVD, PVD, ALD, thermal oxidation, other suitable techniques, or a combination thereof. In the present embodiment, the oxide layer is deposited using a low temperature deposition method, such as a plasma enhanced ALD process. In some embodiments, the plasma enhanced ALD process may be performed in a temperature range from about 150° C. to about 400° C. In some preferable embodiments, the plasma enhanced ALD process is performed in at temperature lower than or equal to 350° C. Oxygen (O2) plasma may be used in the plasma enhanced ALD process with a power range from about 5 W to about 1000 W. The power range for the plasma enhanced ALD process may preferably to be from about 10 W to about 30 W.

At process 306, a plasma treatment is performed to the deposited oxide layer. In some embodiments, the plasma treatment may be performed with a RF power range from about 10 W to about 1000 W. The power range for the plasma treatment may be preferably to be from about 200 W to about 600 W. The O2 flow rate may be in a range from about 10 sccm to about 1000 sccm. The plasma treatment may be performed in a time range from about 10 seconds to about 150 seconds and in a temperature range from about 150° C. to about 400° C. In some preferable embodiments, the plasma enhanced ALD process is performed in at temperature lower than or equal to 350° C. In some embodiments, the plasma enhanced ALD process at the process 304 and the plasma treatment at the process 306 may be performed in-situ in the same deposition tool. In some alternative embodiments, the plasma enhanced ALD process and the plasma treatment may be performed in different deposition tools.

At process 308, a gate stack including a HK dielectric layer and a MG electrode may be formed in the gate region. The HK dielectric layer and the MG electrode may be formed to wrap around the oxide layer.

The present embodiments describe structures and methods for FinFET device including an oxide layer. The mechanisms involve using a low temperature deposition process followed by a plasma treatment to form the oxide layer in the FinFET device. The mechanisms provide improved qualities of the oxide layer with increased density, reduced wet etching rate, and improved device performance. The mechanisms also provide reduced thermal budget for gate oxide formation, thus enabling the application of channel material with high mobility in the CMOS process.

The present disclosure provides a semiconductor structure. In accordance with some embodiments, the semiconductor structure includes a substrate, one or more fins each including a first semiconductor layer formed over the substrate, an oxide layer formed wrapping over an upper portion of each of the one or more fins, and a gate stack including a high-K (HK) dielectric layer and a metal gate (MG) electrode formed wrapping over the oxide layer. The first semiconductor layer may include silicon germanium (SiGex), and the oxide layer may include silicon germanium oxide (SiGexOy).

The present disclosure provides a method for forming a semiconductor device. In accordance with some embodiments, the method includes providing a device precursor. The device precursor includes a substrate and one or more fins each including one or more semiconductor layers formed over the substrate. The method further includes forming a gate trench in a dielectric layer formed over the substrate and between the one or more fins; depositing an oxide layer to wrap over an upper portion of each of the one or more fins exposed in the gate trench; performing a plasma treatment to the deposited oxide layer; and forming a gate stack including a high-K (HK) dielectric layer and a metal gate (MG) electrode to fill in the gate trench.

The present disclosure provides a method forming a semiconductor device. In accordance with some embodiments, the method includes epitaxially growing a silicon germanium (SiGe) layer over a silicon (Si) substrate; etching the SiGe layer and the Si substrate to form one or more fins and one or more isolation trenches; forming one or more isolation features in the one or more isolation trenches; forming a gate trench in a dielectric layer formed over the substrate; depositing an oxide layer to wrap over an upper portion of each of the one or more fins exposed in the gate trench; performing an oxygen (O2) plasma treatment to the deposited oxide layer; and forming a gate stack including a high-K (HK) dielectric layer and a metal gate (MG) electrode to fill in the gate trench. The oxide layer may include a silicon germanium oxide (SiGexOy) layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, the device comprising:
 a substrate;
 one or more fins each including a first semiconductor layer formed over the substrate;
 an oxide layer formed wrapping over an upper portion of each of the one or more fins; and
 a gate stack including a high-K (HK) dielectric layer and a metal gate (MG) electrode formed wrapping over the oxide layer,
 wherein the first semiconductor layer includes silicon germanium (SiGex), and
 wherein the oxide layer includes silicon germanium oxide (SiGexOy).

2. The device of claim 1, wherein the upper portion of each of the one or more fins includes the first semiconductor layer, and
 wherein the oxide layer is formed wrapping over the first semiconductor layer.

3. The device of claim 2, wherein each of the one or more fins includes one or more protruding portions including germanium (Ge) migrated from the SiGex in the first semiconductor layer towards the substrate along sides of the fins, and
 wherein a depth of each of the one or more protruding portions is in a range from about 2.2 nm to about 4.8 nm.

4. The device of claim 1, wherein each of the one or more fins further includes a second semiconductor layer including silicon (Si) formed over the first semiconductor layer, and
 wherein the upper portion of the each of the one or more fins includes the second semiconductor layer.

5. The device of claim 4, wherein each of the one or more fins includes one or more protruding portions including germanium (Ge) migrated from the SiGex in the first semiconductor layer towards the Si in the second semiconductor layer along sides of the fins, and
 wherein a depth of each of the one or more protruding portions is in a range from about 2.2 nm to about 4.8 nm.

6. The device of claim 1, wherein a Ge concentration x of SiGex is in a range from about 10% to about 100%.

7. The device of claim 1, wherein a Ge concentration at a center of a fin is at least about 10% greater than a Ge concentration at a surface of the fin.

8. The device of claim 1, wherein a Ge concentration x of SiGexOy has a graded change in the oxide layer.

9. The device of claim 1, wherein a diffusion depth of Ge from each of the one or more fins to a corresponding oxide layer is in a range from about 2 nm to about 3 nm.

10. The device of claim 1, wherein a thickness of the oxide layer is in a range from about 0.5 nm to about 4 nm.

11. The device of claim 1, further comprising:
 isolation regions formed over the substrate to separate the fins;
 source and drain features formed over the substrate and separated by the gate stack; and
 interlayer dielectric layers formed over the source/drain features and separated by the gate stack.

12. A method of forming a semiconductor device, the method comprising:
 providing a device precursor, the device precursor including:
  a substrate; and
  one or more fins each including one or more semiconductor layers formed over the substrate;

forming a gate trench in a dielectric layer formed over the substrate and between the one or more fins;

depositing an oxide layer to wrap over an upper portion of each of the one or more fins exposed in the gate trench;

performing a plasma treatment to the deposited oxide layer; and forming a gate stack including a high-K (HK) dielectric layer and a metal gate (MG) electrode to fill in the gate trench.

13. The method of claim 12, wherein the depositing the oxide layer includes using a plasma enhanced atomic layer deposition process in a temperature range from about 150° C. to about 400° C.

14. The method of claim 13, wherein the plasma enhanced atomic layer deposition process includes using an oxygen (O2) plasma with a power range from about 10 W to about 30 W, and wherein the power used in the plasma enhanced atomic layer deposition is less than a power used in the plasma treatment.

15. The method of claim 12, wherein the performing the plasma treatment includes using an oxygen (O2) plasma with a flow rate in a range from about 10 sccm to about 1000 sccm.

16. The method of claim 12, wherein the performing the plasma treatment includes using an oxygen (O2) plasma with a power range from about 200 W to about 600 W.

17. The method of claim 12, wherein the performing the plasma treatment includes applying the O2 plasma in a time range from about 10 seconds to about 150 seconds and in a temperature range from about 150° C. to about 400° C.

18. The method of claim 12, wherein the depositing the oxide layer and the performing the plasma treatment are performed in-situ in a same deposition tool.

19. A method of forming a semiconductor device, the method comprising:

epitaxially growing a silicon germanium (SiGe) layer over a silicon (Si) substrate;

etching the SiGe layer and the Si substrate to form one or more fins and one or more isolation trenches;

forming one or more isolation features in the one or more isolation trenches;

forming a gate trench in a dielectric layer formed over the substrate;

depositing an oxide layer to wrap over an upper portion of each of the one or more fins exposed in the gate trench;

performing an oxygen (O2) plasma treatment to the deposited oxide layer; and forming a gate stack including a high-K (HK) dielectric layer and a metal gate (MG) electrode to fill in the gate trench, wherein the oxide layer includes a silicon germanium oxide (SiGexOy) layer.

20. The method of claim 19, wherein the depositing the oxide layer includes using a low temperature deposition performed in a temperature range from about 150° C. to about 350° C.

* * * * *